US008749967B2

(12) United States Patent
Dang

(10) Patent No.: US 8,749,967 B2
(45) Date of Patent: Jun. 10, 2014

(54) MOUNTING STRUCTURE FOR MINI PCI-E EQUIPMENT AND A COMPUTER USING THE SAME

(75) Inventor: Ken Dang, Shenzhen (CN)

(73) Assignee: PC Partner (Dongguan) Limited, Samtuen Village, Houjie District, Dongguan, Guangdong (CN)

( * ) Notice: Subject to any disclaimer, the term of this patent is extended or adjusted under 35 U.S.C. 154(b) by 445 days.

(21) Appl. No.: 13/041,861

(22) Filed: Mar. 7, 2011

(65) Prior Publication Data

US 2011/0228462 A1 Sep. 22, 2011

(30) Foreign Application Priority Data

Mar. 17, 2010 (CN) .................. 2010 2 0134791 U
Mar. 17, 2010 (CN) .................. 2010 2 0134801 U
Mar. 17, 2010 (CN) .................. 2010 2 0134809 U

(51) Int. Cl.
*G06F 1/16* (2006.01)
*G06F 1/18* (2006.01)
(52) U.S. Cl.
CPC .................................. *G06F 1/185* (2013.01)
USPC .................... 361/679.4; 361/736; 710/313
(58) Field of Classification Search
CPC .................................. G06F 1/185; H05K 7/1429
USPC ............ 361/679.4, 679.01, 679.02, 807, 809,
361/810, 724–727, 737, 752, 736, 740, 741,
361/747, 742, 748, 754, 755, 756, 758, 759,
361/761, 764, 769, 679.33, 679.37, 679.22;
710/313; 711/114
See application file for complete search history.

(56) References Cited

U.S. PATENT DOCUMENTS

| 5,590,023 | A  | * | 12/1996 | Hernandez et al. ......... 361/679.6 |
| 6,317,318 | B1 | * | 11/2001 | Kim ......................... 361/679.33 |
| 6,547,073 | B1 | * | 4/2003  | Lee ................................ 206/378 |
| 8,031,465 | B2 | * | 10/2011 | Chen et al. ............... 361/679.54 |
| 8,199,511 | B2 | * | 6/2012  | Kim et al. ..................... 361/737 |
| 2007/0208973 | A1 | * | 9/2007 | Wu et al. ....................... 714/724 |

FOREIGN PATENT DOCUMENTS

CN 201179793 * 1/2009

* cited by examiner

*Primary Examiner* — Anthony Haughton
*Assistant Examiner* — Ingrid Wright
(74) *Attorney, Agent, or Firm* — Global IP Services; Tianhua Gu

(57) ABSTRACT

The present invention relates to amounting structure for Mini PCI-E equipment is provided. The mounting structure comprises a Mini PCI-E slot and a fixing bracket, wherein the Mini PCI-E slot is welded on surface of a motherboard with an opening upward and perpendicular to the motherboard, the fixing bracket is close to the Mini PCI-E slot and fixed vertically on the motherboard. The fixing bracket includes a first fixing device which includes at least two mounting holes at the same height. The present invention also disclosed a computer using the above mounting structure. The mounting structure of the present invention could significantly reduce the area on the motherboard occupied by the Mini PCI-E equipment via setting the Mini PCI-E slots and the mounting bracket perpendicular to the motherboard. The above mounting structure could also improve the performance of heat dissipation of the Mini PCI-E equipment.

20 Claims, 4 Drawing Sheets

MOUNTING STRUCTURE FOR MINI PCI-E EQUIPMENT AND A COMPUTER USING THE SAME

CROSS REFERENCE TO RELATED PATENT APPLICATION

The present application claims the priorities of the Chinese patent applications No. 201020134791.4 filed on Mar. 17, 2010, No. 201020134801.4 filed on Mar. 17, 2010 and No. 201020134809 filed on Mar. 17, 2010, which applications are incorporated herein by reference.

FIELD OF THE INVENTION

The present invention relates to a mounting structure for electronic equipment, and particularly, relates to a mounting structure for Mini PCI-E equipment and a computer using the same.

BACKGROUND OF THE INVENTION

With the development of computer technology, transmission of digital signal is becoming bottleneck of performance improvement for communications between the computer and the peripheral equipment. There are many interfaces within computers now, for example, PCI, PCI-X, PCI-E, SATA, SCSI etc. A Mini PCI-E interface developed from Mini PCI-E specification is proverbially used in portable equipment such as a laptop computer. Now, the hardware equipment using a Mini PCI-E interface comprises a Bluetooth adapter, a video card, a wireless network card etc.

The larger the proportion of people's daily lives accounted by the mobile working is, the smaller the volume of the computer (such as a laptop computer) desired by people is. Meanwhile, wireless life has become a kind of fashion. As shown in FIG. 1, when the traditional Mini PCI-E equipment 11 is connected to the motherboard, the Mini PCI-E equipment 11 is spread on the motherboard, that is, parallel to the motherboard. An area of 56×38 mm or 32×38 mm on the motherboard is occupied by the Mini PCI-E equipment 11. Accordingly, a slot of the Mini PCI-E connector is fixed parallel to the motherboard.

As the Mini PCI-E equipment is assembled on and parallel to the motherboard, the Mini PCI-E equipment occupies more space on the motherboard inevitably, which is contrary to the concept of small computers. As the Mini PCI-E equipment is installed close to the motherboard, it is not conducive for heat dissipation which would make the Mini PCI-E equipment working unstable. In addition, when the slot of the Mini PCI-E equipment is parallel to the motherboard, it makes space for pluging-and-socketing the Mini PCI-E equipment smaller, so that make it hard to install the Mini PCI-E equipment.

SUMMARY OF THE INVENTION

The main object of the present invention is to provide a mounting structure for Mini PCI-E equipment and a computer using the same so as to overcome the disadvantages encountered during using the conventional projection equipment, such as big occupied space, insufficient heat dissipation and small operation space.

In one aspect of the present invention, a mounting structure for Mini PCI-E equipment is provided. The mounting structure comprises a Mini PCI-E slot and a fixing bracket, wherein the Mini PCI-E slot is welded on surface of a motherboard with an opening upward and perpendicular to the motherboard, the fixing bracket is close to the Mini PCI-E slot and fixed vertically on the motherboard. The fixing bracket includes a support frame with two sides located at both ends of the Mini PCI-E slot, and a sliding board, wherein each of the insides of the two sides is provided with a vertical chute close to the Mini PCI-E slot. The sliding board is plugged into the chute and a fixing device is arranged on a side of the sliding board which facing the Mini PCI-E slot.

Advantageously, the lower lateral of the outside of the support frame is provided with a positioning column used to fix the support frame on the motherboard through a bolt.

Advantageously, the height of the support frame is larger than or equal to the height of Mini PCI-E half-card equipment, and smaller than the height of Mini PCI-E full-card equipment, and the height of the sliding board is smaller than or equal to the height of the Mini PCI-E half-card equipment. In present invention, Mini PCI-E half-card equipment means PCI-E card equipment having a half height of PCI-E full-card equipment.

According to another aspect of the present invention, a mounting structure for Mini PCI-E equipment is provided, the mounting structure comprises a Mini PCI-E slot and a fixing bracket, wherein the Mini PCI-E slot is welding on surface of a motherboard with an opening upward and perpendicular to the motherboard, the fixing bracket is close to the Mini PCI-E slot and fixed vertically on the motherboard. The fixing bracket is provided with a first fixing device which includes at least two fixing holes at the same height.

Advantageously, the first fixing device includes at least two nuts riveted to the fixing holes or at least two snaps inserted into the fixing holes.

Advantageously, the fixing bracket includes a fixing part close to a side of the Mini PCI-E slot and a support frame with two sides located at both ends of the Mini PCI-E slot, and the first fixing device is setting on the fixing part of the fixing bracket.

Advantageously, the fixing part of the fixing bracket is provided with a thermovent. Advantageously, the bottom of the fixing bracket is provided with a pin plugged into the motherboard.

Advantageously, the fixing bracket is provided with a second fixing device located at a different height from the first fixing device, and the second fixing device includes at least two fixing holes at the same height and at least two nuts or snaps fitting on the fixing holes.

Advantageously, the distance from the second fixing device to the surface of the motherboard is equal to the height of the Mini PCI-E half-card equipment.

Advantageously, the distance from the first fixing device to the surface of the motherboard is equal to the height of Mini PCI-E full-card equipment.

Advantageously, the height of the fixing bracket is equal to 56 mm or 32 mm.

According to another aspect of the present invention, a computer with Mini PCI-E equipment is provided, the computer comprises a motherboard, a Mini PCI-E slot and a fixing bracket, wherein the Mini PCI-E slot is welding on surface of a motherboard with an opening upward and perpendicular to the motherboard, the fixing bracket is close to the Mini PCI-E slot and fixed vertically on the motherboard. The fixing bracket includes a first fixing device which includes at least two fixing holes at the same height.

Advantageously, the first fixing device includes at least two nuts riveted to the fixing holes or at least two snaps inserted into the fixing holes.

Advantageously, the fixing bracket includes a fixing part close to a side of the Mini PCI-E slot and a support frame with two sides located at both ends of the Mini PCI-E slot, and the first fixing device is setting on the fixing part of the fixing bracket.

Advantageously, the fixing part of the fixing bracket is provided with a thermovent, and the bottom of the fixing bracket is provided with a pin plugged into the motherboard.

Advantageously, the fixing bracket is provided with a second fixing device located at a different height from the first fixing device, and the second fixing device includes at least two fixing holes at the same height and at least two nuts or snaps fitting on the fixing holes.

Advantageously, the distance from the second fixing device to the surface of the motherboard is equal to the height of Mini PCI-E half-card equipment.

Advantageously, the distance from the first fixing device to the surface of the motherboard is equal to the height of Mini PCI-E full-card equipment.

Advantageously, the fixing bracket includes a support frame with two sides located at both ends of the Mini PCI-E slot and a sliding board; each of the insides of the two sides is provided with a vertical chute close to the Mini PCI-E slot; the sliding board is plugged into the chute, the fixing device is arranged on a side of the sliding board which facing the Mini PCI-E slot.

The mounting structure for Mini PCI-E equipment and the computer using the same in accordance with the present invention could significantly reduce the area on the motherboard occupied by the Mini PCI-E equipment via setting the Mini PCI-E slots and the fixing bracket perpendicular to the motherboard. The above mounting structure could also improve the performance of heat dissipation of the Mini PCI-E equipment. In addition, the mounting structure in accordance with the present invention could be fit for different types of Mini PCI-E equipment.

BRIEF DESCRIPTION OF THE DRAWINGS

The present invention will become more fully understood from the detailed description given herein below for illustration only, and which thus is not limitative of the present invention, and wherein.

DETAIL DESCRIPTION OF THE INVENTION

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art.

Accordingly to one embodiment of present invention, the Mini PCI-E equipment is vertically installed to the motherboard, so as to significantly reduce the space of the motherboard occupied by the Mini PCI-E equipment, and facilitate the installation and disassembly of the Mini PCI-E equipment. In addition, the mounting structure of the invention meets different types of Mini PCI-E equipment.

Figure 1:
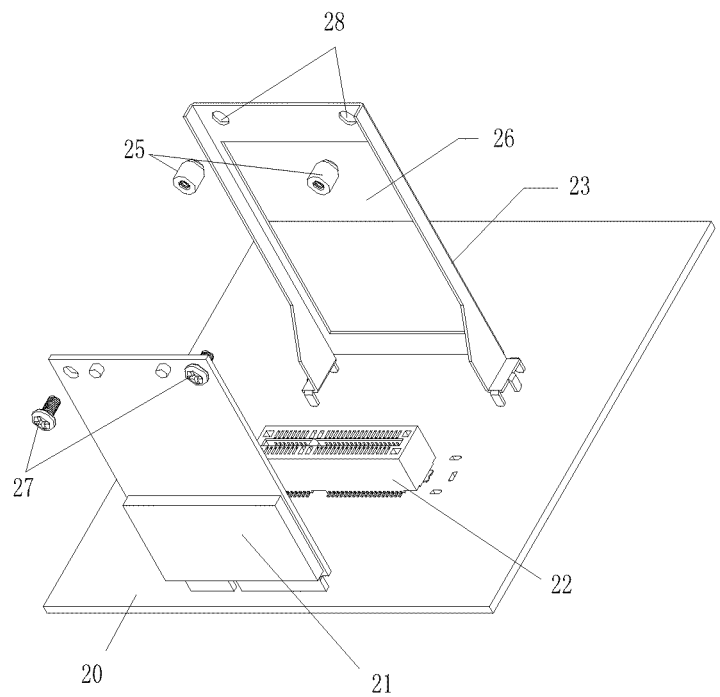
FIG. 1 shows a mounting structure for Mini PCI-E equipment in accordance with the first embodiment of the present invention.

As shown in FIG. 1, in the first embodiment of the present invention, the mounting structure for the Mini PCI-E equipment includes a Mini PCI-E slot 22 and a fixing bracket 23. The Mini PCI-E slot 22 is welding on the surface of a motherboard 20 with the opening upward and perpendicular to the motherboard 20. The fixing bracket 23 is close to the Mini PCI-E slot 22 and fixed vertically on the motherboard 20.

The fixing bracket 23 is provided with a fixing device which includes at least two fixing holes 28, two bolts 25 and two nuts 27 matching the bolts 25. The two fixing holes 28 are at the same height. In present embodiment, the two fixing holes 28 are at the top of the fixing bracket 23. The two bolts 25 are fixed (riveted, for example) on the two fixing holes 28 respectively. The Mini PCI-E slot 22 is welded to the surface of the motherboard 20 in the mode of SMT or DIP. The fixing bracket 23 is welded on the motherboard 20 in the mode of DIP. The two bolts 25 are riveted on the fixing bracket 23. The bottom of the fixing bracket 23 is provided with pins which would be plugged into the sockets on the motherboard 20 and then welded to the motherboard 20 when mounting the fixing bracket 23.

Of course, in practice, the number of nuts in the mounting structure can be adjusted according to actual needs. And the nuts 27 and bolts 25 can also be instead by other device, such as the snaps, which can be plugged directly into the fixing holes 28. When mounting the Mini PCI-E equipment 21 to the motherboard 20, the golden finger on the bottom of the Mini PCI-E equipment 21 is plugged into the Mini PCI-E slot 22, and then the bolts 25 are screwed to the nuts 27 of the fixing bracket 23. Thus the Mini PCI-E equipment 21 is mounted to the fixing bracket 23 and remained stable.

In the mounting structure for Mini PCI-E equipment, the fixing bracket 23 includes a fixing part close to the side of the Mini PCI-E slot 22 and a support frame with two sides located at both ends of the Mini PCI-E slot 22. Otherwise, a thermovent 26 could be provided on the fixing part of the fixing bracket 23 for heat dissipation.

Figure 2:
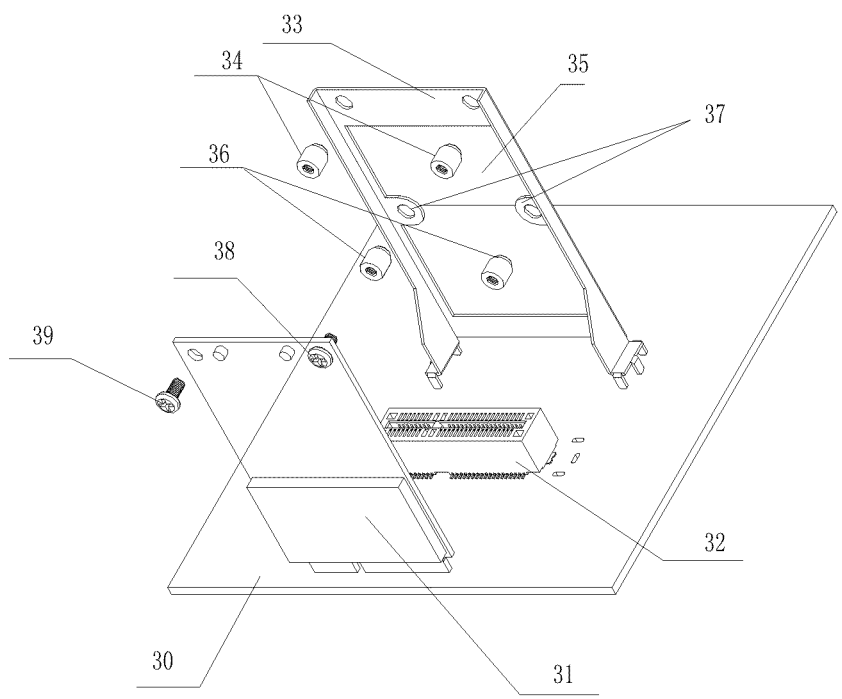
FIG. 2 shows a mounting structure for Mini PCI-E equipment in accordance with the second embodiment of the present invention.

As shown in FIG. 2, the mounting structure for Mini PCI-E equipment in accordance with the second embodiment of the present invention includes a Mini PCI-E slot 32 fixed on the motherboard 30 and a fixing bracket 33 arranged close to the Mini PCI-E slot 32. The fixing bracket 33 is provided with a first fixing device and a second fixing device located at a different height from the first fixing device. The first fixing device includes at least two nuts 34 at the same height. The second fixing device includes at least two nuts 36 at the same height. The Mini PCI-E slot 32 is welded on the upper surface of the motherboard 30 in the mode of SMT or DIP while the fixing bracket 33 is welded on the motherboard 30 in the mode of DIP. The first nuts 34 and the second nuts 36 are riveted on the fixing bracket 33.

Of course, in practice, the number of nuts in each fixing device can be adjusted according to actual needs. And one or more fixing devices can be provided to the fixing bracket in accordance with the different structure of other types of Mini PCI-E equipment.

When mounting the Mini PCI-E equipment 31 to the motherboard 30, the golden finger on the bottom of the Mini PCI-E equipment 31 is plugged into the Mini PCI-E slot 32, and then the bolts 38, 39 are screwed to first nuts 34 (or the second nuts 36) of the fixing bracket 33. Thus the Mini PCI-E equipment 31 is mounted to the fixing bracket 33 and remained stable. Of course, in practice, the bolts and nuts can be instead by the snaps and fixing holes.

The same as the mounting structure in the first embodiment, the fixing bracket 33 in accordance with the second embodiment of the present invention includes a fixing part close to the side of the Mini PCI-E slot 32 and a support frame with two sides located at both ends of the Mini PCI-E slot 22. Otherwise, a thermovent 35 could be provided on the fixing part for heat dissipation. The bottom of the fixing bracket 33 is provided with pins which would be plugged into the socket on the motherboard 30 and then welded to the motherboard 30 when mounting the fixing bracket 33. Especially, the nuts 36 of the second fixing device are arranged in the thermovent 35 via the fixing lugs 37.

Figure 3:
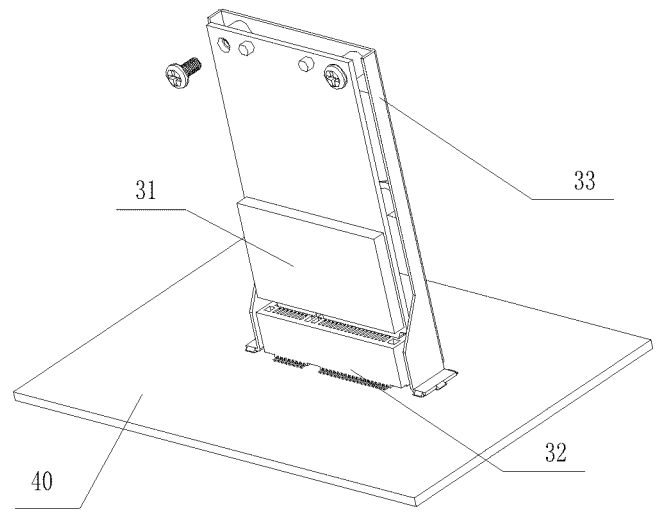
FIG. 3 shows Mini PCI-E full-card equipment mounted to the mounting structure shown in FIG. 2.
Figure 4:
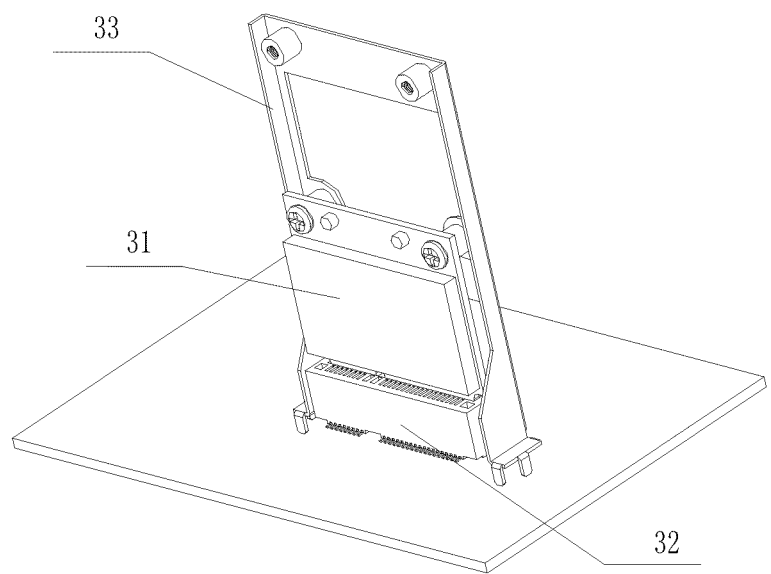
FIG. 4 shows Mini PCI-E half-card equipment mounted to the mounting structure shown in FIG. 2.

The above mounting structure for Mini PCI-E equipment is fit for the Mini PCI-E full-card equipment and the Mini PCI-E half-card equipment. Accordingly, the distance from the first fixing device (which includes the nuts 34) of the fixing bracket 33 to the surface of the motherboard 30 is equal to the height of the Mini PCI-E full-card equipment as shown in FIG. 3 and the height of the fixing bracket 33 could be equal to the height of the Mini PCI-E full-card equipment, while the distance from the second fixing device (which includes the nuts 36) to the surface of the motherboard is equal to the height of Mini PCI-E half-card equipment as shown in FIG. 4 and the height of the fixing bracket 33 could be equal to the height of the Mini PCI-E half-card equipment.

Figure 5:
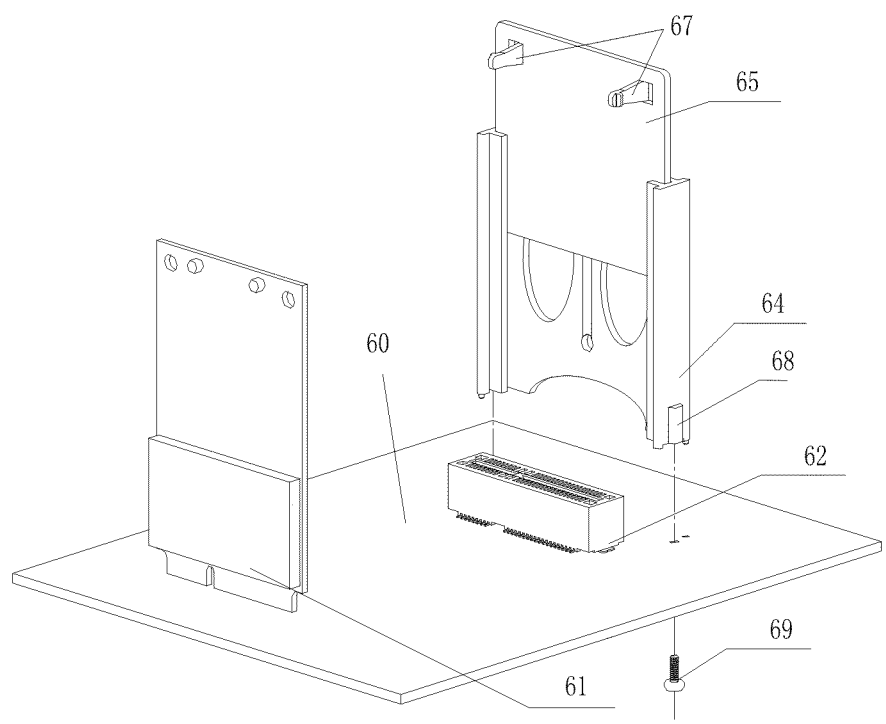
FIG. 5 shows a mounting structure for Mini PCI-E equipment in accordance with the third embodiment of the present invention.

As shown in FIG. 5, the mounting structure in accordance with the third embodiment of the present invention includes Mini PCI-E slots 62 and a fixing bracket. The Mini PCI-E slots 62 is welded on the surface of the motherboard 60 with the opening upward and perpendicular to the motherboard, while the fixing bracket is close to the Mini PCI-E slot and fixed vertically on the motherboard 60.

The fixing bracket includes a support frame 64 and a sliding board 65. The support frame 64 is provided with two sides at both ends of the Mini PCI-E slot 62. Each of the insides of the two sides of the sliding board 65 is provided with a vertical chute close to the Mini PCI-E slot 62. The sliding board 65 is plugged into the chute and the sliding board 65 is provided with a fixing device on the side facing the Mini PCI-E slot 62. The fixing device includes two snaps 67 at the same height. Otherwise, the fixing device may include two nuts at the same height (as the nuts shown in FIG. 1 and FIG. 2). Of course, in practice, the number of the snaps 67 or nuts of the fixing device could be adjusted in accordance with actual need. And the two snaps 67 or nuts could be at a different height only if they were fit for the fixing holes on the Mini PCI-E equipment.

When mounting the Mini PCI-E equipment 61 to the motherboard 60, the golden finger on the bottom of the Mini PCI-E equipment 61 is plugged into the Mini PCI-E slot 62, and then the snaps 67 are pushed into the fixing holes on the Mini PCI-E equipment 61. Thus the Mini PCI-E equipment 61 is mounted to the fixing bracket 33 and remained stable.

The lower lateral of the outside of the support frame 64 is provided with positioning columns 68 used to fix the support frame 64 on the motherboard 60 through bolts 69 which passed through the motherboard 60 and engaged to the positioning columns 68. The Mini PCI-E slot 62 is welded on the motherboard 60 in the mode of SMT or DIP.

In the present embodiment, the snaps 67 or nuts could be located on the top of the sliding board 65. Otherwise, thermovents could be provided on the board of the support frame 64 connecting the two sides of the support frame 64, so as to enhance heat dissipation.

In the present embodiment, the support frame 64 and the sliding board 65 of the fixing bracket could be plastic. In practice, the fixing bracket could be metal and the fixing bracket could be welded on the motherboard 60. For example, the bottom of the fixing bracket 64 could be provided with pins which plugging into the fixing holes of the motherboard 60 and then welding to the motherboard 60.

Figure 7:
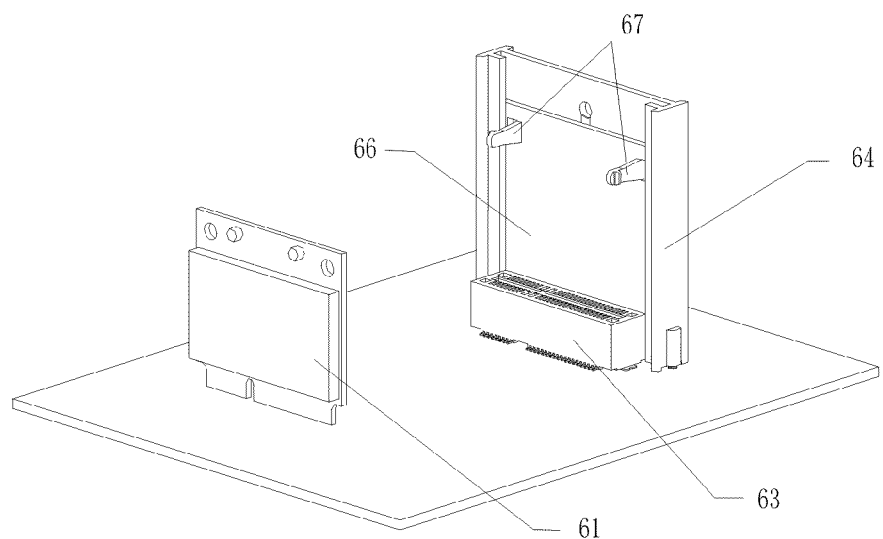
FIG. 7 shows Mini PCI-E half-card equipment mounted to the mounting structure shown in FIG. 5.

The height of sliding board 65 of the mounting structure for the Mini PCI-E equipment could be equal to the height of Mini PCI-E half-card equipment so that the mounting structure for the Mini PCI-E equipment could be used to fix the Mini PCI-E half-card equipment. At this time, the sliding board 65 can be slid to the bottom of the chute of the support frame 64 and then used to fix the Mini PCI-E equipment on the mounting structure using the snaps 67 or nuts, as shown in FIG. 7.

Figure 6:
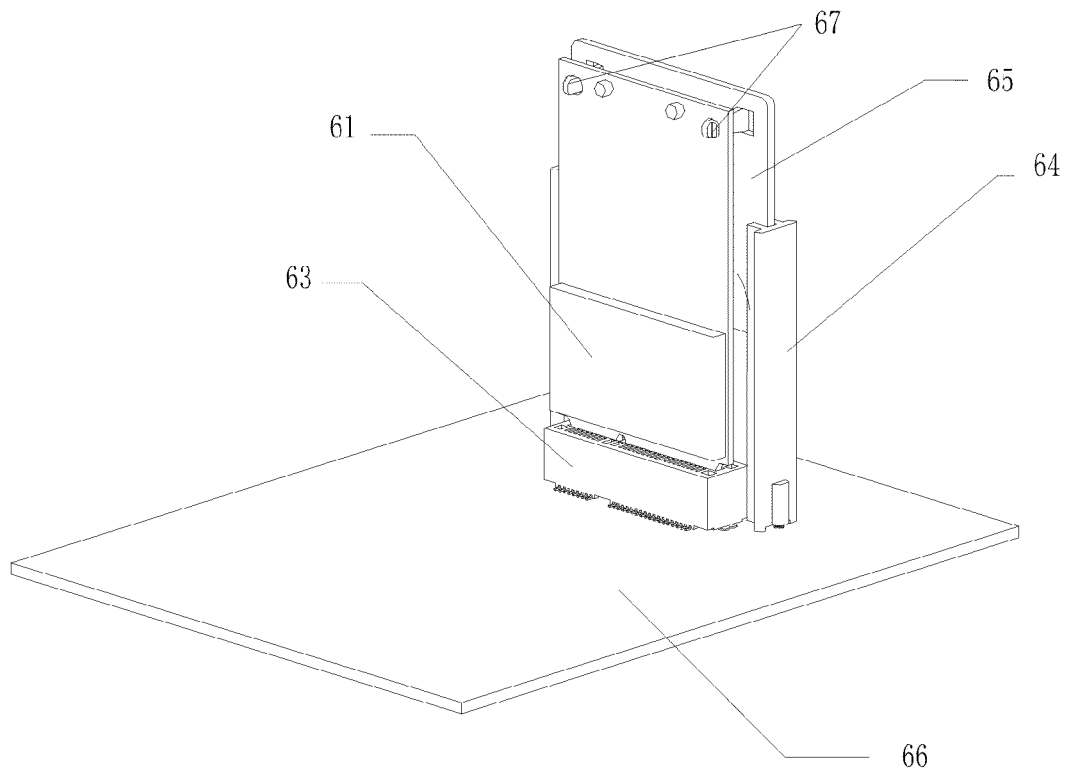
FIG. 6 shows Mini PCI-E full-card equipment mounted to the mounting structure shown in FIG. 5.

The height of the support frame 64 of the above mounting structure for Mini PCI-E equipment should be not smaller than the height of the Mini PCI-E half-card equipment and be smaller than the height of the Mini PCI-E full-card equipment. Thus the mounting structure for Mini PCI-E equipment could be fit for the Mini PCI-E equipment while the sliding board 65 is slid to the top of the chute of the support frame 64 and then fixing the Mini PCI-E equipment on the mounting structure using the snaps 67 or nuts, as shown in FIG. 6.

The mounting structure for Mini PCI-E equipment only occupies the area of the motherboard for the cross section of the Mini PCI-E slot and the fixing frame (about 38×8 mm) by enabling the Mini PCI-E slot and the fixing frame to be perpendicular to the motherboard. Thus, the area on the motherboard occupied by the Mini PCI-E equipment could be reduced significantly. Furthermore, the performance of heat dissipation could be improved for the Mini PCI-E equipment is never close to the motherboard. Due to the erection mounting of the Mini PCI-E equipment, the Mini PCI-E equipment could be more convenient to mount or remove. The Mini PCI-E equipment could be easier to be upgraded. The new structure could reduce the difficult of production and could lead to lower cost.

Equipment, such as a computer or a notebook computer including the above mounting structure for Mini PCI-E equipment is also disclosed in accordance with the embodiment of the present invention. While the present invention has been described with reference to certain embodiments, it will be understood by those skilled in the art that various changes maybe made and equivalents maybe substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:
1. A mounting structure for Mini PCI-E equipment comprising:
a Mini PCI-E slot and a fixing bracket;

the Mini PCI-E slot is welded on a surface of a motherboard with an opening upward and perpendicular to the motherboard;

the fixing bracket is close to the Mini PCI-E slot and fixed vertically on the motherboard;

the fixing bracket includes a support frame with two sides located at both ends of the Mini PCI-E slot and a sliding board, each inside of the two sides of the support frame is provided with a vertical chute close to the Mini PCI-E slot; the sliding board is plugged into the couple of chutes and the sliding board is provided with a fixing device on a side facing the Mini PCI-E slot.

2. The mounting structure for Mini PCI-E equipment according to claim 1, wherein a bottom of the support frame is provided with a positioning column used to fix the support frame on the motherboard through a bolt.

3. The mounting structure for Mini PCI-E equipment according to claim 1, wherein a height of the support frame is larger than or equal to a height of Mini PCI-E half-card equipment, and smaller than a height of Mini PCI-E full-card equipment, and a height of the sliding board is smaller than or equal to the height of the Mini PCI-E half-card equipment.

4. A mounting structure for Mini PCI-E equipment comprising a Mini PCI-E slot and a fixing bracket, wherein the Mini PCI-E slot is welding on a surface of a motherboard with an opening upward and perpendicular to a motherboard, the fixing bracket is close to the Mini PCI-E slot and fixed vertically on the motherboard; the fixing bracket is provided with a first fixing device which includes at least two fixing holes at the same height.

5. The mounting structure for Mini PCI-E equipment according to claim 4, wherein the first fixing device includes at least two nuts riveted with the fixing holes or at least two snaps inserted into the fixing holes.

6. The mounting structure for Mini PCI-E equipment according to claim 4, wherein the fixing bracket includes a fixing part close to a side of the Mini PCI-E slot and a support frame with two sides located at both ends of the Mini PCI-E slot, and the first fixing device is setting on the fixing part of the fixing bracket.

7. The mounting structure for Mini PCI-E equipment according to claim 6, wherein the fixing part of the fixing bracket is provided with a thermovent.

8. The mounting structure for Mini PCI-E equipment according to claim 4, wherein a bottom of the fixing bracket is provided with a pin plugged into the motherboard.

9. The mounting structure for Mini PCI-E equipment according to claim 4, wherein the fixing bracket is provided with a second fixing device located at a different height from the first fixing device, and the second fixing device includes at least two fixing holes at the same height and at least two nuts or snaps fitted on the fixing holes.

10. The mounting structure for Mini PCI-E equipment according to claim 9, wherein a distance from the second fixing device to the surface of the motherboard is equal to a height of Mini PCI-E half-card equipment.

11. The mounting structure for Mini PCI-E equipment according to claim 4, wherein a distance from the first fixing device to the surface of the motherboard is equal to a height of Mini PCI-E full-card equipment.

12. The mounting structure for Mini PCI-E equipment according to claim 4, wherein a height of the mounting bracket is equal to 56 mm or 32 mm.

13. A computer with Mini PCI-E equipment comprising a motherboard, a Mini PCI-E slot and a fixing bracket, wherein the Mini PCI-E slot is welding on surface of a motherboard with an opening upward and perpendicular to the motherboard, the fixing bracket is close to the Mini PCI-E slot and fixed vertically on the motherboard; the fixing bracket includes a first fixing device which includes at least two fixing holes at the same height.

14. The computer with Mini PCI-E equipment according to claim 13, wherein the first fixing device includes at least two nuts riveted to the fixing holes or at least two snaps inserted into the fixing holes.

15. The computer with Mini PCI-E equipment according to claim 13, wherein the fixing bracket includes a fixing part close to a side of the Mini PCI-E slot and a support frame with two sides located at both ends of the Mini PCI-E slot, and the first fixing device is setting on the fixing part of the fixing bracket.

16. The computer with Mini PCI-E equipment according to claim 15, wherein the fixing part of the fixing bracket is provided with a thermovent, and a bottom of the fixing bracket is provided with a pin plugged into the motherboard.

17. The computer with Mini PCI-E equipment according to claim 13, wherein the fixing bracket is provided with a second fixing device located at a different height from the first fixing device, and the second fixing device includes at least two fixing holes at the same height and at least two nuts or snaps fitting on the fixing holes.

18. The computer with Mini PCI-E equipment according to claim 17, wherein a distance from the second fixing device to the surface of the motherboard is equal to the height of Mini PCI-E half-card equipment.

19. The computer with Mini PCI-E equipment according to claim 13, wherein a distance from the first fixing device to the surface of the motherboard is equal to a height of Mini PCI-E full-card equipment.

20. The computer with Mini PCI-E equipment according to claim 13, wherein the fixing bracket includes a support frame with two sides located at both ends of the Mini PCI-E slot and a sliding board; each of the insides of the two sides is provided with a vertical chute close to the Mini PCI-E slot; the sliding board is plugged into the chute, the fixing device is arranged on a side of the sliding board which facing the Mini PCI-E slot.

* * * * *